(12) United States Patent
McGregor et al.

(10) Patent No.: US 10,090,409 B2
(45) Date of Patent: Oct. 2, 2018

(54) METHOD FOR FABRICATING LDMOS WITH SELF-ALIGNED BODY

(71) Applicant: Monolithic Power Systems, Inc., San Jose, CA (US)

(72) Inventors: Joel M. McGregor, Issaquah, WA (US); Deming Xiao, Los Altos Hills, CA (US); Zeqiang Yao, Santa Clara, CA (US); Ji-Hyoung Yoo, Los Gatos, CA (US); Jeesung Jung, San Jose, CA (US)

(73) Assignee: Monolithic Power Systems, Inc., San Jose, CA (US)

(*) Notice: Subject to any disclaimer, the term of this patent is extended or adjusted under 35 U.S.C. 154(b) by 0 days.

(21) Appl. No.: 15/279,190

(22) Filed: Sep. 28, 2016

(65) Prior Publication Data
US 2018/0090613 A1  Mar. 29, 2018

(51) Int. Cl.
| | | |
|---|---|---|
| *H01L 21/265* | (2006.01) | |
| *H01L 29/06* | (2006.01) | |
| *H01L 29/78* | (2006.01) | |
| *H01L 29/10* | (2006.01) | |
| *H01L 29/40* | (2006.01) | |
| *H01L 29/49* | (2006.01) | |
| *H01L 29/66* | (2006.01) | |

(52) U.S. Cl.
CPC ...... *H01L 29/7816* (2013.01); *H01L 29/1095* (2013.01); *H01L 29/401* (2013.01); *H01L 29/4916* (2013.01); *H01L 29/6656* (2013.01); *H01L 29/66681* (2013.01)

(58) Field of Classification Search
None
See application file for complete search history.

(56) References Cited

U.S. PATENT DOCUMENTS

| | | | | |
|---|---|---|---|---|
| 2001/0011722 A1* | 8/2001 | Frisina | ............... | H01L 29/0696 257/1 |
| 2003/0173624 A1* | 9/2003 | Choi | ................... | H01L 29/1095 257/368 |
| 2011/0244644 A1* | 10/2011 | Zuniga | ............. | H01L 29/42368 438/286 |
| 2012/0199905 A1* | 8/2012 | Nitta | ................... | H01L 29/4175 257/343 |
| 2016/0260831 A1* | 9/2016 | Prasad | ............... | H01L 29/7806 |

* cited by examiner

*Primary Examiner* — Charles Garber
*Assistant Examiner* — Xiaoming Liu
(74) *Attorney, Agent, or Firm* — Perkins Coie LLP

(57) ABSTRACT

A method for fabricating a LDMOS device, including: forming a semiconductor substrate; forming a dielectric layer atop the semiconductor substrate and an electric conducting layer on the dielectric layer; forming a first photoresist layer on the electric conducting layer; patterning the first photoresist layer through a first mask to form a first opening; etching the electric conducting layer through the first opening; implanting dopants of a first doping type into the semiconductor substrate through the first opening to form a first body region adjacent to the surface of the semiconductor substrate, and a second body region located beneath the first body region; removing the first photoresist layer; etching the electric conducting layer using a second photoresist layer and a second mask.

7 Claims, 10 Drawing Sheets

METHOD FOR FABRICATING LDMOS WITH SELF-ALIGNED BODY

TECHNICAL FIELD

The present invention generally relates to semiconductor devices, and more particularly but not exclusively relates to methods for fabricating Laterally Diffused Metal Oxide Semiconductor (LDMOS) devices.

BACKGROUND

In the fabrication of LDMOS power transistors as part of an integrated circuit manufacturing process, for performance and cost reasons, it is desirable for power transistors to be as small as possible. For cost reasons, it is also desirable to minimize the number of photomasking steps in the manufacturing process.

A prior art integrated LDMOS transistor is shown in cross-section in FIG. 1. Power LDMOS transistors are usually laid out in stripes with very large width with source and drain stripes alternating. The active area of the LDMOS is the product of the total width and the Halfpitch, which, the Halfpitch as shown in FIG. 1, is the distance between the center of the source stripe and the center of the drain stripe.

Heavily doped N+ and P+ regions are fabricated in the source stripes to contact the source and body, respectively. Under the N+ and P+ regions, there is a p-type shallow body region. The side-diffusion of this region under the gate polysilicon defines the channel of the LDMOS. The implants forming this region are shallow enough that the gate polysilicon could form an effective implant blocker, meaning that the shallow body region can be self-aligned to the polysilicon edge.

There also needs to be a p-type deep body region within the source stripe. This deep body region increases the radius of curvature of the body to drain junction and reduces the electrical resistance of the body region under the N+ source, thereby prevents the turn-on of a parasitic NPN transistor under high drain voltage conditions, which could cause device destruction.

Since the deep body implants must have a projected range of up to approximately 0.5 um, the gate polysilicon of the LDMOS, which is typically 0.1-0.3 um thick, is not enough to block the deep implants. Therefore the deep body region must be defined by its own photomasking step, using a photoresist layer at least 0.8 um thick. This photomasking step can be done either before the poly gate definition (as in the simplified process flow of FIG. 2a) or after poly gate definition (as in FIG. 2b). Either way, since the deep body and gate polysilicon are defined by two different masks, there will be a misalignment between them which varies from wafer to wafer and site to site on the same wafer. If the deep body implants overlap the poly gate, threshold voltage of the LDMOS will increase by an amount dependant on the overlap. To avoid large variation of threshold voltage, the deep body mask opening must be spaced inside the source opening by an amount larger than the side-diffusion of the deep implants plus the maximum misalignment between the masks. This increases the minimum size of the source/body region.

Another way to produce a device with acceptably low threshold voltage variation would be to overlap the deep body implants and the poly gate by an amount much larger than the maximum misalignment. This has the disadvantage of increasing the channel length and halfpitch of the device.

From the foregoing discussion it can be concluded that an invention which reduces the area of the source/body region (and hence the LDMOS) while not increasing the total number of photomasking steps would be useful to a manufacturer of power integrated circuits.

SUMMARY

The embodiments of the present invention are directed to a method for fabricating an LDMOS device, comprising: forming a semiconductor substrate; forming a dielectric layer atop the semiconductor substrate; forming an electric conducting layer on the dielectric layer; forming a first photoresist layer on the electric conducting layer; patterning the first photoresist layer through a first mask to form a first opening; etching the electric conducting layer through the first opening; implanting dopants of a first doping type into the semiconductor substrate through the first opening, to form a first body region adjacent to the surface of the semiconductor substrate, and a second body region located beneath the first body region; removing the first photoresist layer; etching the electric conducting layer using a second photoresist layer and a second mask.

The embodiments of the present invention are also directed to an LDMOS device fabricated in a semiconductor substrate. The LDMOS device comprises: a gate oxide region formed atop the semiconductor substrate; a gate polysilicon region formed on the gate oxide region; a first body region of a first doping type formed in the semiconductor substrate, wherein the first body region is located at a first side of the gate polysilicon region and adjacent to the surface of the semiconductor substrate; a second body region of the first doping type formed beneath the first body region; a source region of a second doping type formed in the first body region; a drain region of the second doping type formed in the semiconductor substrate and at a second side of the gate polysilicon region; wherein the gate polysilicon region, the first body region and the second body region are defined by the same mask and are self-aligned.

The embodiments of the present invention are further directed to a method for fabricating an LDMOS device, comprising: forming a semiconductor substrate; forming a gate oxide layer atop the semiconductor substrate; forming a gate polysilicon layer on the gate oxide layer; etching the gate polysilicon layer using a first mask; implanting dopants of a first doping type into the semiconductor substrate using the first mask, to form a first body region adjacent to the surface of the semiconductor substrate, and a second body region located beneath the first region; etching the gate polysilicon layer using a second mask to form a gate region of the LDMOS; forming a source region of a second doping type in the first body region which is located at one side of the gate region; and forming a drain region of the second doping type in the semiconductor substrate at the other side of the gate region.

BRIEF DESCRIPTION OF THE DRAWING

The present invention can be further understood with reference to the following detailed description and the appended drawings, wherein like elements are provided with like reference numerals. The drawings are only for illustration purpose, thus may only show part of the devices and are not necessarily drawn to scale.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

The terms "left," right," "in," "out," "front," "back," "up," "down, "top," "atop", "bottom," "over," "under," "beneath," "above," "below" and the like in the description and the claims, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein.

Figure 1:
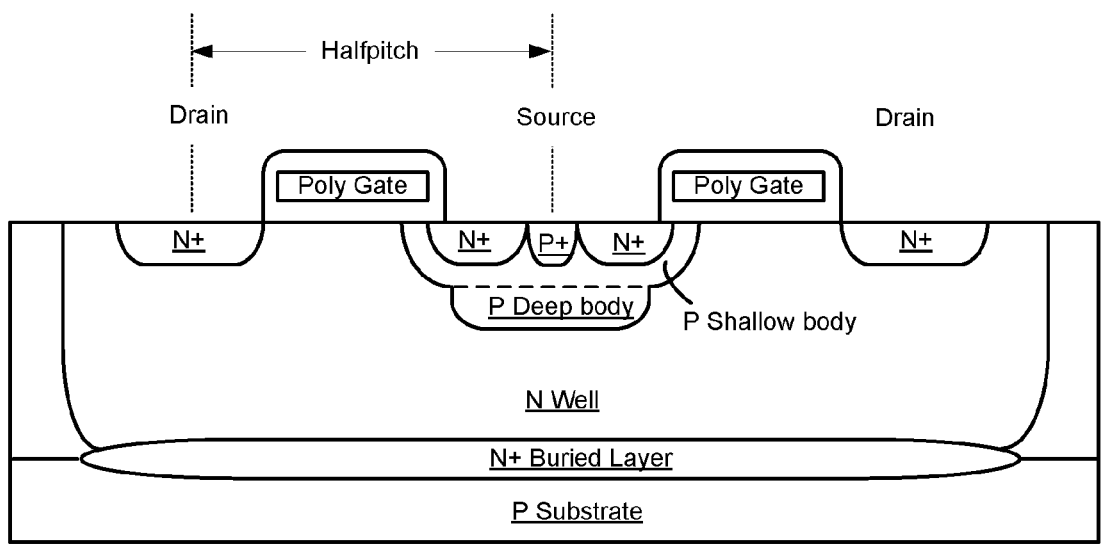
FIG. 1 shows a prior art LDMOS.

In prior generations of LDMOS transistors as shown in FIG. 1, the gate polysilicon and the deep p-type body implants in the center of the source/body region are defined by two different masks. To ensure acceptably small variation of threshold voltage and on-resistance, the gate polysilicon and the deep p-type body implants must either be spaced apart or overlap by a distance greater than the maximum misalignment between the masking layers. These solutions have a penalty of large source opening, long poly width, or high on-resistance. LDMOS devices according to embodiments of the present invention use the same mask for poly etch and deep body implants, therefore reduce minimum source opening size and variation in threshold voltage and on-resistance.

Figure 3:
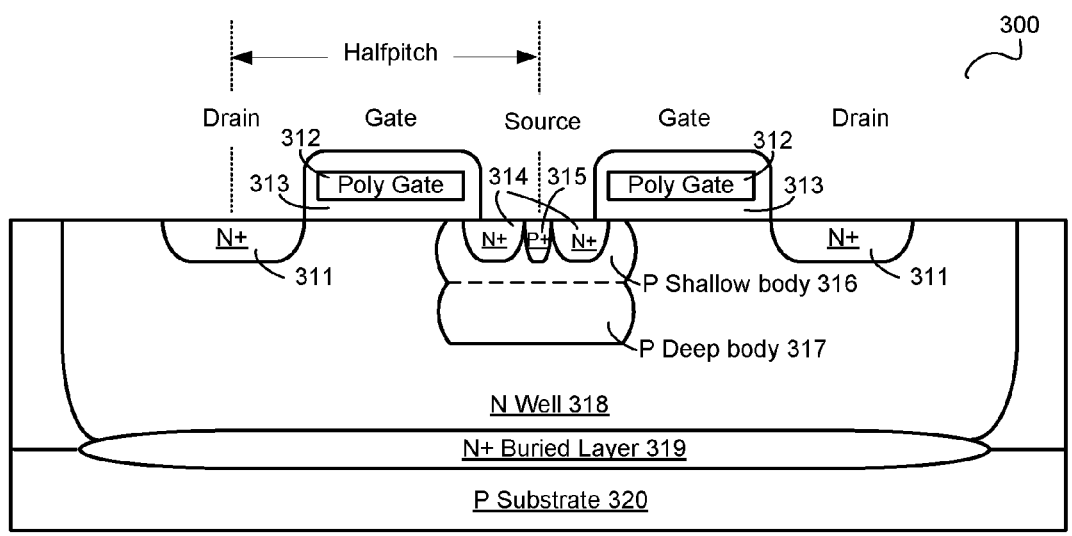
FIG. 3 illustrates a sectional view of an LDMOS 300 with self-aligned body in accordance with an embodiment of the present invention.

FIG. 3 shows an LDMOS 300 in accordance with an embodiment of the present invention. The LDMOS 300 is formed in a semiconductor substrate consisting of a P type original substrate 320, an N+ Buried Layer (NBL) 319 and an N-well 318. The semiconductor substrate may have other circuits or devices, such as BJT and CMOS, integrated in it. In some embodiments, the semiconductor substrate may have other configurations. For example, the N+ Buried Layer is optional and could be omitted. And instead of being formed directly in the original substrate 320, the N-well 318 may be formed in an N type epitaxial layer which is deposited on the original substrate 320. Furthermore, there could further be a p-type "Resurf" layer under the N-well 318.

The LDMOS 300 includes a drain region 311, a gate polysilicon region 312, a gate oxide region 313, a source region 314, a body contact region 315, a shallow body region 316 and a deep body region 317. The LDMOS 300 is usually laid out in stripes with very large width, with source and drain stripes alternating. Normally, there is gate seal oxide formed atop and at the sidewall of the gate polysilicon region 312. But it could be omitted or replaced by other structures in some other embodiments.

Heavily doped source region 314 and body contact region 315 are both fabricated in the shallow body region 316 to provide good ohmic contact. Usually they are disposed as in FIG. 3, with a P+ stripe in the middle and N+ stripes on both sides. However, other arrangements, for example with N+ and P+ alternating in the width direction, are possible.

Compared with the prior art shown in FIG. 1, the gate polysilicon etch, the shallow body implants and the deep body implants in the LDMOS 300 are all defined by the same mask, thus the gate polysilicon region 312, shallow body region 316 and deep body region 317 are "self-aligned". By doing so, the LDMOS 300 provides a roughly vertical body/drain junction below the edges of the gate polysilicon region 312.

Figure 4:
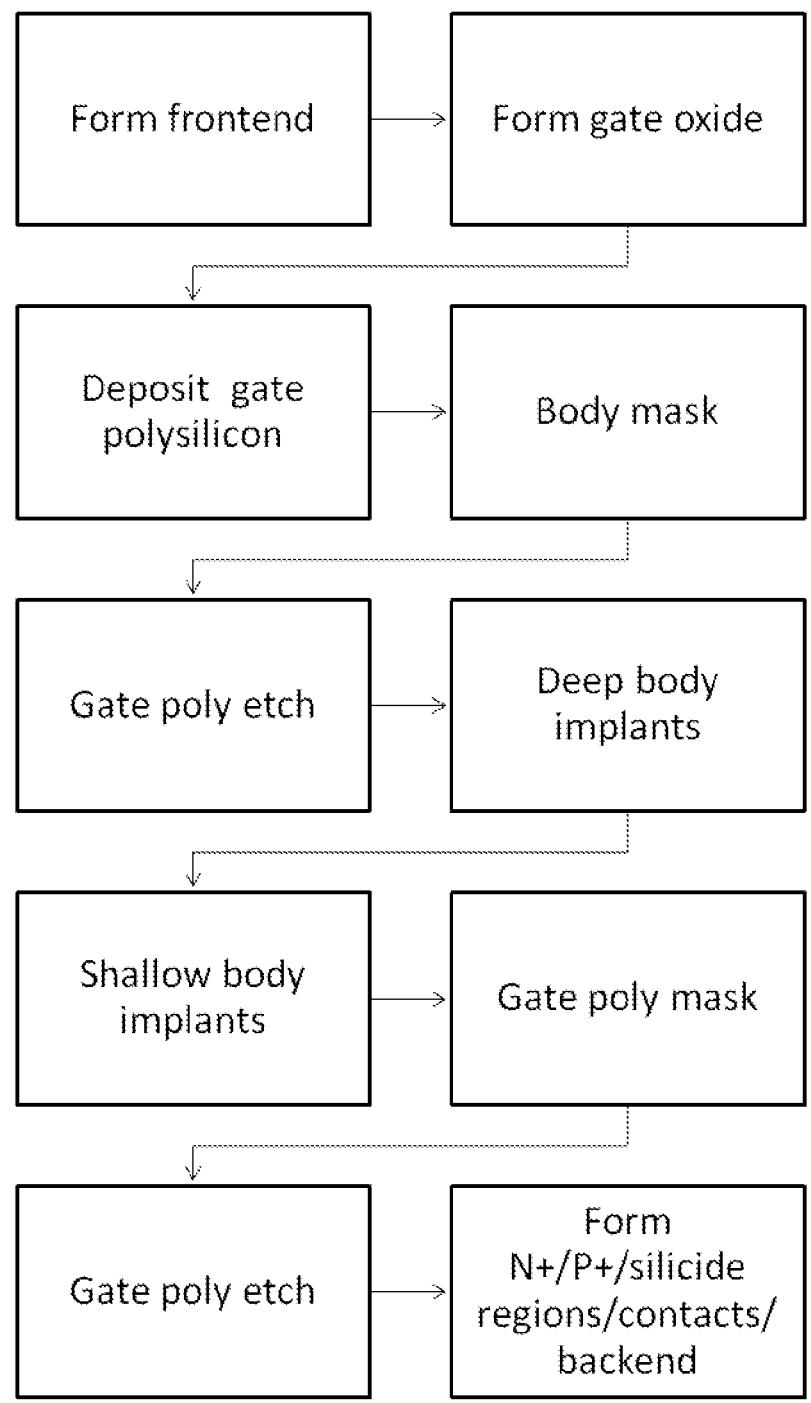
FIG. 4 is a simplified process flowchart outlining a method for fabricating LDMOS in accordance with an embodiment of the present invention.

The process flow used to create the structure is outlined in FIG. 4, and cross-sections of the LDMOS 300 at various stages of fabrication are shown in FIGS. 5a-5i.

Figure 2A:
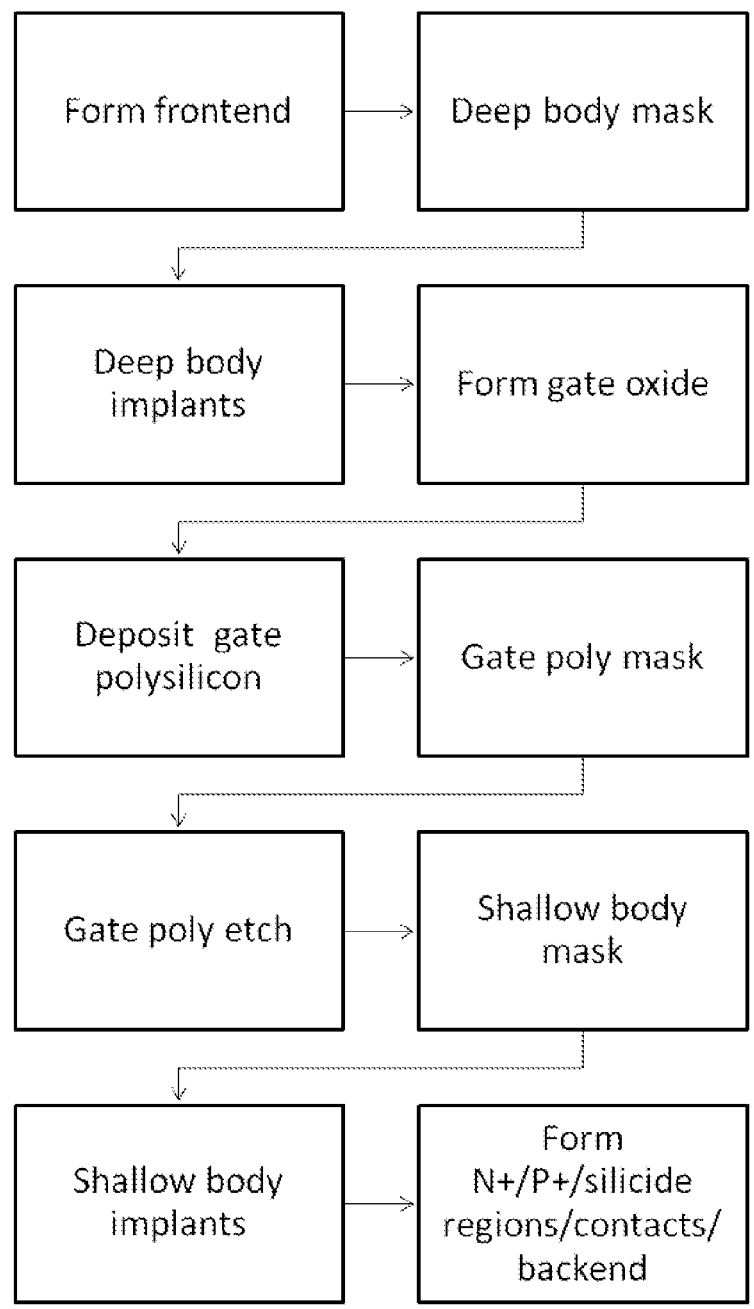
FIGS. 2a and 2b are simplified process flowcharts outlining two possible manufacturing processes that could be used to fabricate the device of FIG. 1.
Figure 2B:
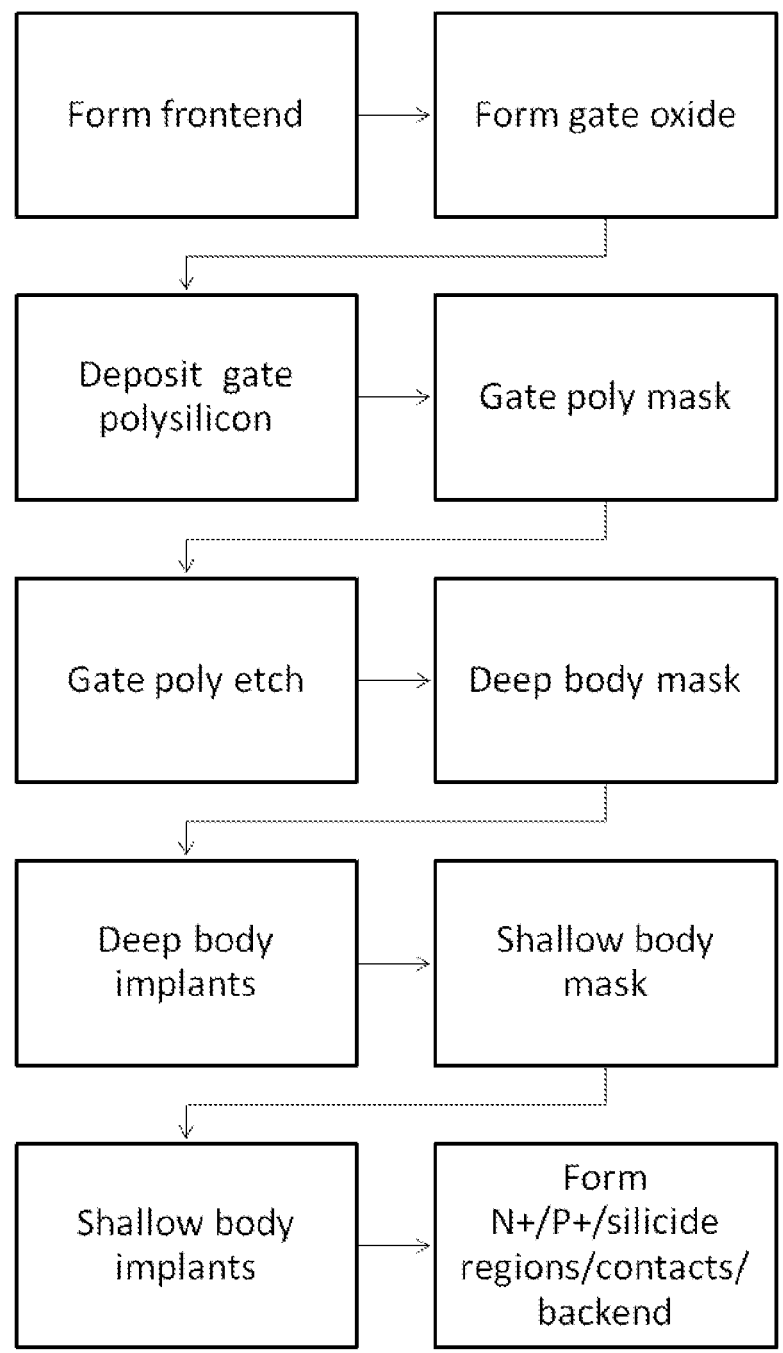
Figure 5A:
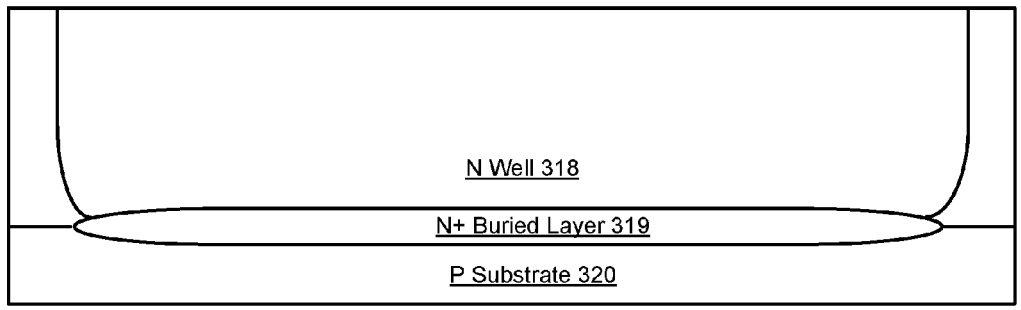
FIGS. 5a-5i illustrate the LDMOS at various stages of fabrication using the fabricating method shown in FIG. 4.
Figure 5B:
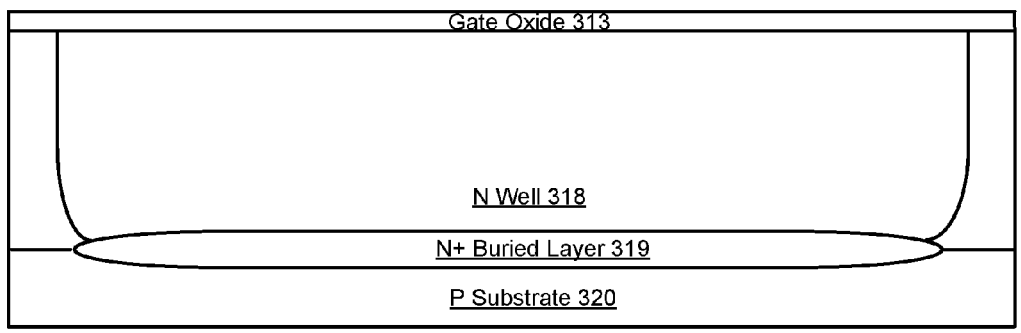
Figure 5C:
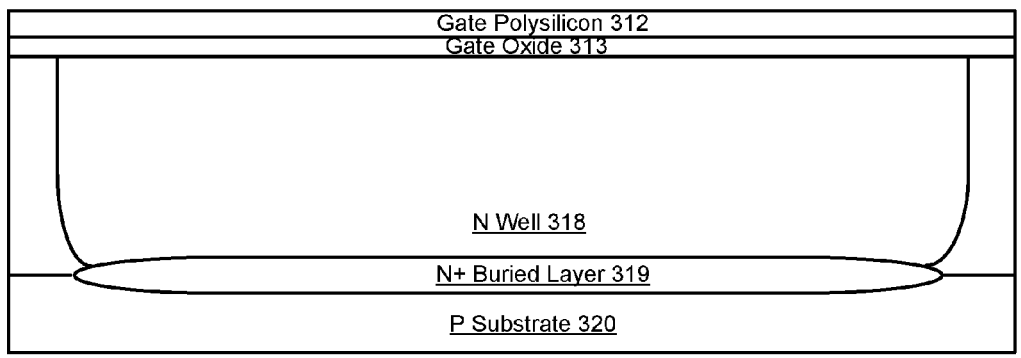

Up until gate polysilicon definition, the process flow is similar to prior art shown in FIG. 2b. The frontend processing may comprise preparing an original substrate 320, forming N+ buried layer 319, defining active area and forming N-well 318, as illustrated in FIG. 5a. Then, as illustrated in FIG. 5b, a top surface of the semiconductor substrate is oxidized to form a gate oxide layer 313. Next, in FIG. 5c, polysilicon is deposited to form a gate polysilicon layer 312 which is later patterned as a gate by etching. It is well known in the art that the gate oxide layer 313 is used as a dielectric layer and the gate polysilicon layer 312 is used as an electric conducting layer, and may be replaced by other proper materials.

Figure 5D:
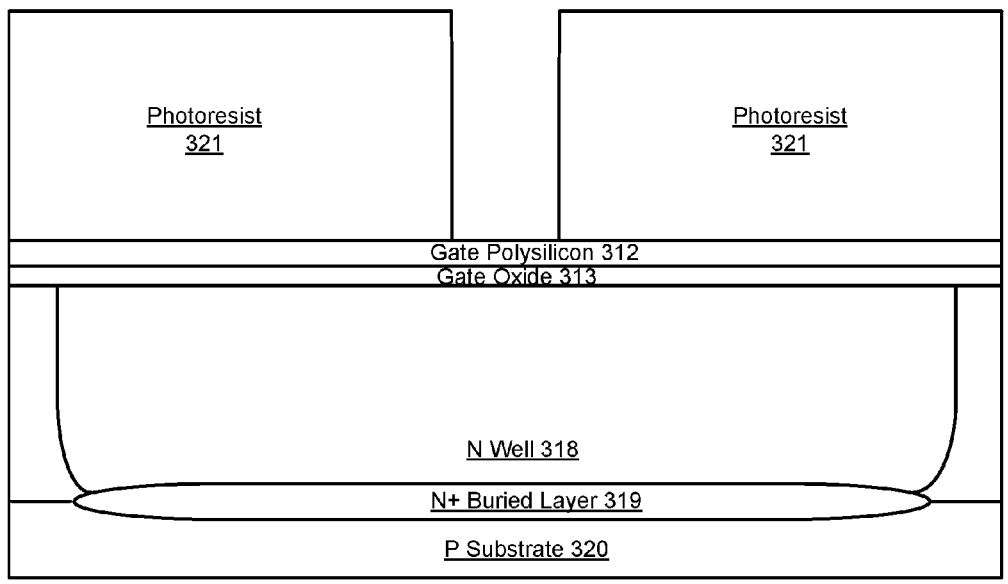

Unlike the prior art, before gate polysilicon etch, the body definition step is done through a photoresist layer 321. As shown in FIG. 5d, a photoresist layer 321 is formed on the gate polysilicon layer 312 and then patterned using a body mask to form a source opening. All other regions of the wafer are covered with photoresist. This step must use thick photoresist, so that the combined thicknesses of the gate polysilicon layer 312 and the photoresist layer 321 are enough to block the highest-energy deep body implant.

Figure 5E:
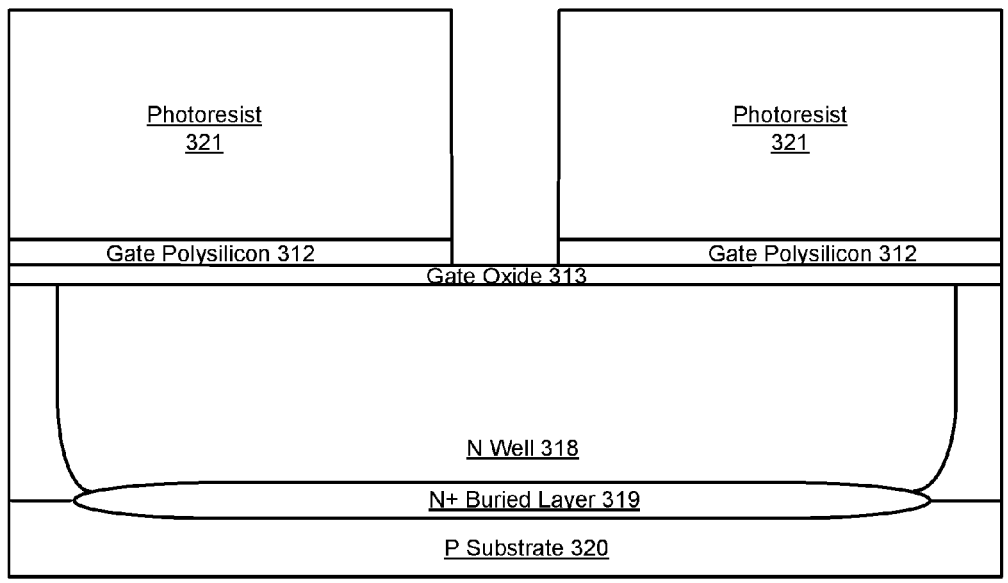
Figure 5F:
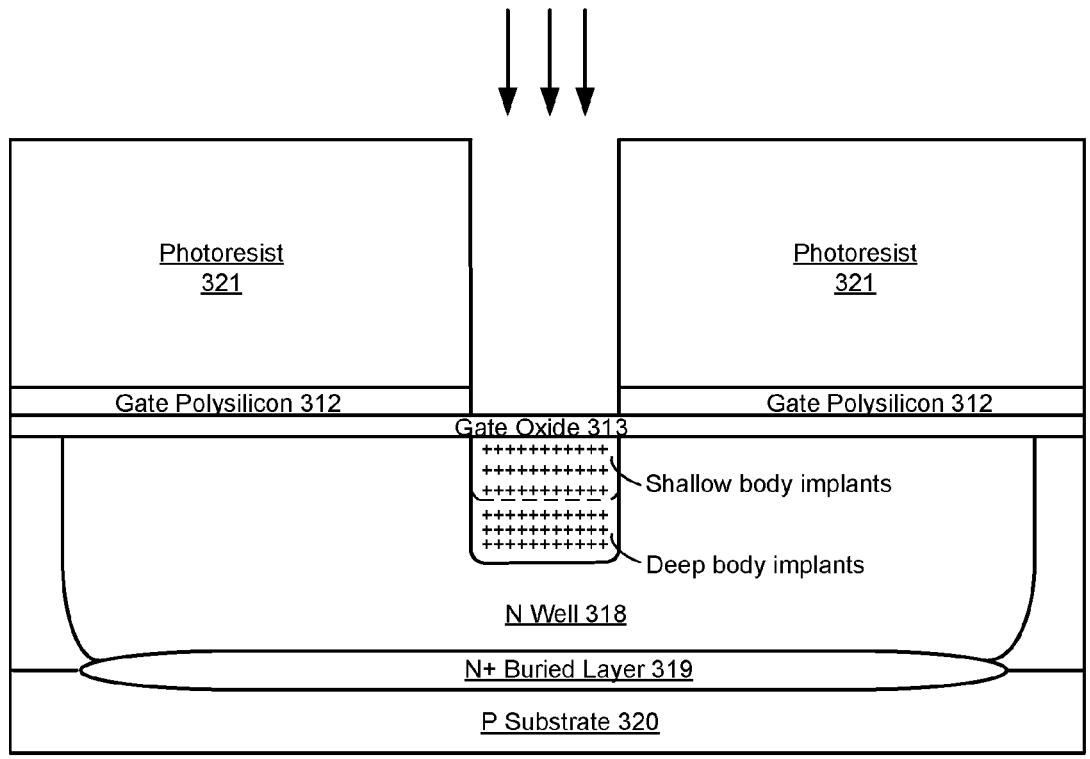

Subsequently, this photoresist layer 321 is used to etch the gate polysilicon layer 312, as shown in FIG. 5e. Then, without removing the photoresist layer 321, the deep and shallow body implants (acceptor ions such as boron and indium) are done through the source opening as illustrated in FIG. 5f.

Figure 5G:
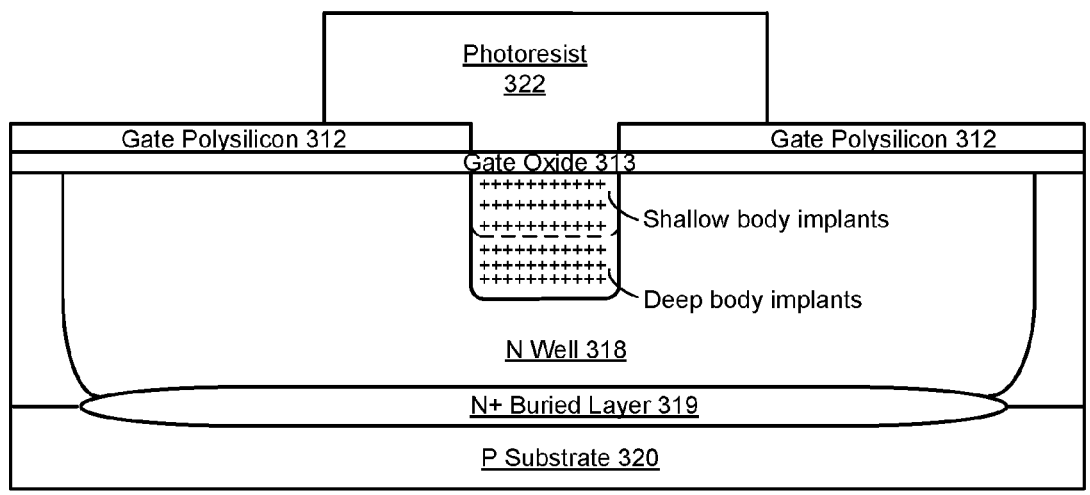
Figure 5H:
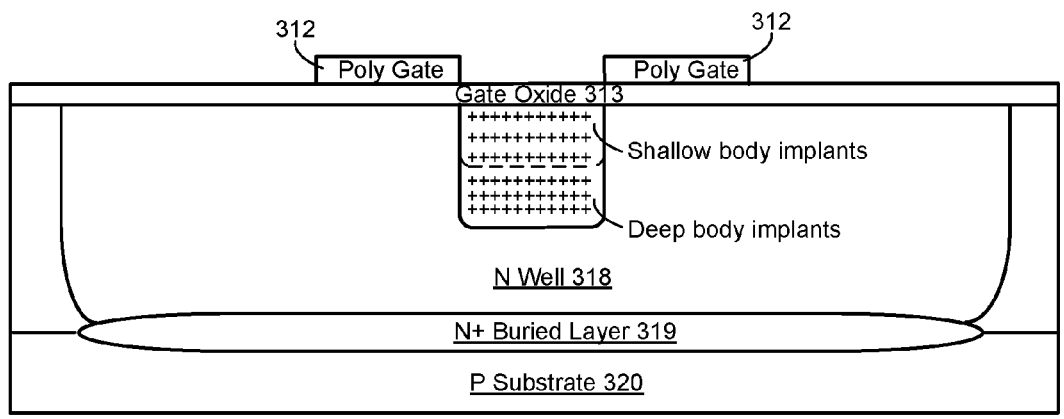
Figure 5I:
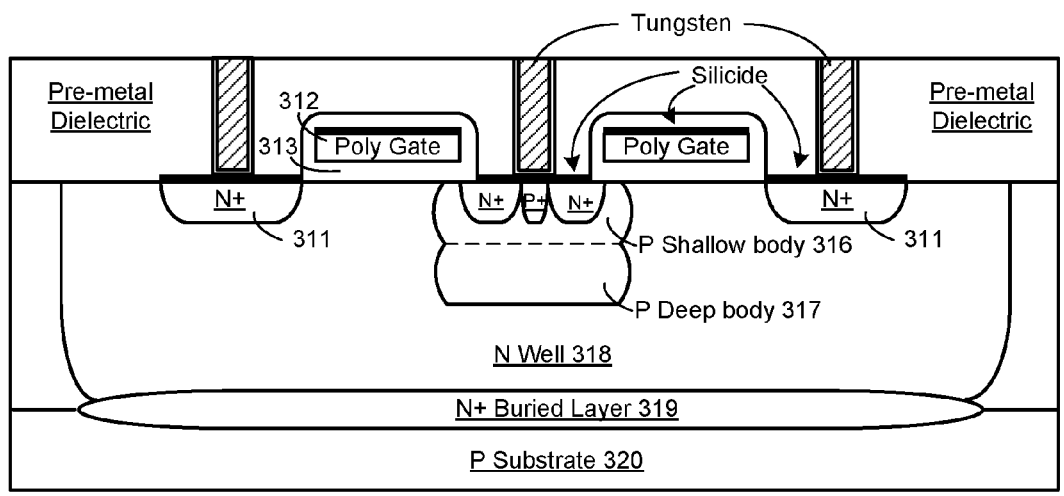

After removal of the photoresist layer 321, a second photoresist layer 322 is deposited and then patterned using a gate poly mask, as shown in FIG. 5g. This photoresist layer 322 is used to etch the other side of the gate polysilicon. After removal of the photoresist layer 322 as illustrated in FIG. 5h, the process continues as usual, including poly seal oxidation, N+ and P+ implantation and activation, silicide formation, contacts, and backend. FIG. 5i shows the LDMOS device in cross-section after tungsten plug contact formation.

A rough estimate of the area saving made possible by this invention is now made. The minimum photoresist opening that can be manufacturably and cost-effectively defined is about one-third of the photoresist thickness T_block. T_block is defined by the energy of the highest-energy deep body implant. If the side-diffusion of deep body plus maximum misalignment between gate and deep body masks is d, then the minimum source opening for the prior art method is approximately:

(T_block/3)+2*d.

For the self-aligned method of the invention, the photoresist thickness can be reduced approximately by the thickness T_poly of the gate polysilicon. The minimum source opening is therefore approximately:

(T_block−T_poly)/3.

Using ballpark values of 0.95 um for T_block, 0.2 um for T_poly, and 0.15 um for d, the minimum opening shrinks from 0.62 um to 0.25 um, which is a significant reduction.

Deep body and shallow body implants are combined into one mask using this method. Assuming that in the prior art process, the deep body mask is a dedicated mask used only in the LDMOS region, the method of this invention reduces the number of photomasking steps in the Integrated Circuit process by one. This can reduce the wafer cost of the finished wafer by a non-negligible amount (several percent).

Besides the constraint caused by mask misalignment mentioned above, there is another factor which could also limit the minimum size of the source opening. That is the minimum opening required to pattern three distinct heavily doped surface regions (source regions and body contact region, N+/P+/N+) inside the opening while maintaining strong ohmic contact to both source and body.

Figure 6:
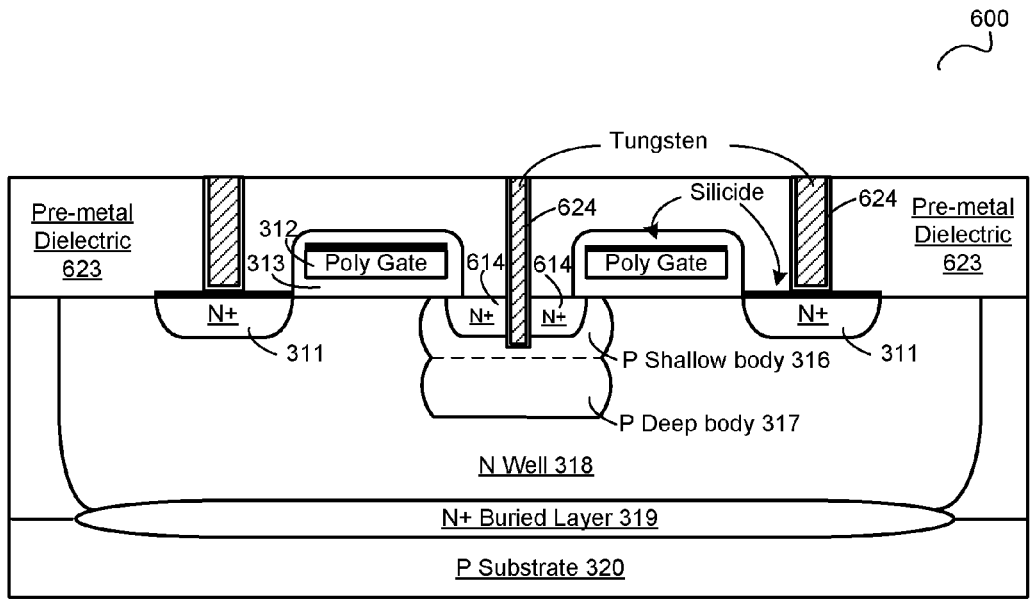
FIG. 6 illustrates a sectional view of an LDMOS 600 in accordance with another embodiment of the present invention.

FIG. 6 shows an LDMOS in accordance with another embodiment of the present invention, which reduces the area of the source/body region by eliminating the need to pattern butted N+ and P+ regions inside the source/body region.

The shallow and deep body implants, self-aligned to the gate polysilicon, span the entire source opening. Implanted after spacer formation (oxide and/or nitride spacers formed at the sidewalls of the gate polysilicon to define the source region), an N+ source implant also spans the entire source opening. The junction depth of the N+ source region 614 inside the shallow body region 316 is quite shallow, typically on the order of 0.1 um. This is true because directly under the N+ source, the acceptor concentration is quite heavy to increase the ruggedness of the LDMOS.

After silicidation of the gate and drain regions of the LDMOS, a pre-metal dielectric layer 623 (also called contact dielectric) is formed. It consists of various doped and undoped deposited oxides, nitrides, oxynitrides, and/or carbides, and isolates the first metal layer from the devices below.

Afterwards, a photoresist layer is formed and a trench contact mask is used to image trench contact openings in the shape of long stripes down the center of all LDMOS sources. Then the pre-metal dielectric 623 is etched, for example, using a standard contact etch recipe. After that, inside the trench contact openings, silicon is etched away to form a trench with a depth greater than the maximum junction depth of the N+ source region 614—typically 0.15-0.2 um. The photoresist is stripped, and then regular contacts are defined and etched. After the regular contact photoresist is stripped, a contact liner 624 is deposited on the top of the wafer, covering the edges and bottom of both regular contacts and trench contacts. This contact liner 624 is typically a glue layer of titanium followed by a barrier layer of titanium nitride. A subsequent rapid thermal anneal step reduces oxygen-containing residues at the bottom of the contacts and makes the contact liner 624 a diffusion barrier to fluorine in the subsequent tungsten deposition step. Finally, the contacts are completed when they are filled with CVD tungsten, then polished back so all tungsten, and all contact liner, are removed from the top of the pre-metal dielectric 623. No special silicidation in the trench contact is required, since both the N+ source region 614 and the shallow body region 316 underneath the N+ source region 614 have high enough concentration so that the titanium of the contact liner forms a low-resistance titanium silicide contact.

The trench source contact solution illustrated in FIG. 6 requires only a blanket N+ region all the way across the source opening, thus reduces the opening size. Although the trench source contact is fabricated ahead of the regular contacts in the process described above, it is possible to be done afterwards. Moreover, tungsten which is used to form tungsten plug contacts could also be replaced by other suitable metal.

In practical applications, it may be difficult to remove photoresist from small contact openings, so in some embodiments the etch-photoresist strip-liner deposition-rapid thermal anneal-tungsten CVD-planarization sequence is repeated twice, once for the trench contacts and once for the regular contacts.

Figure 7:
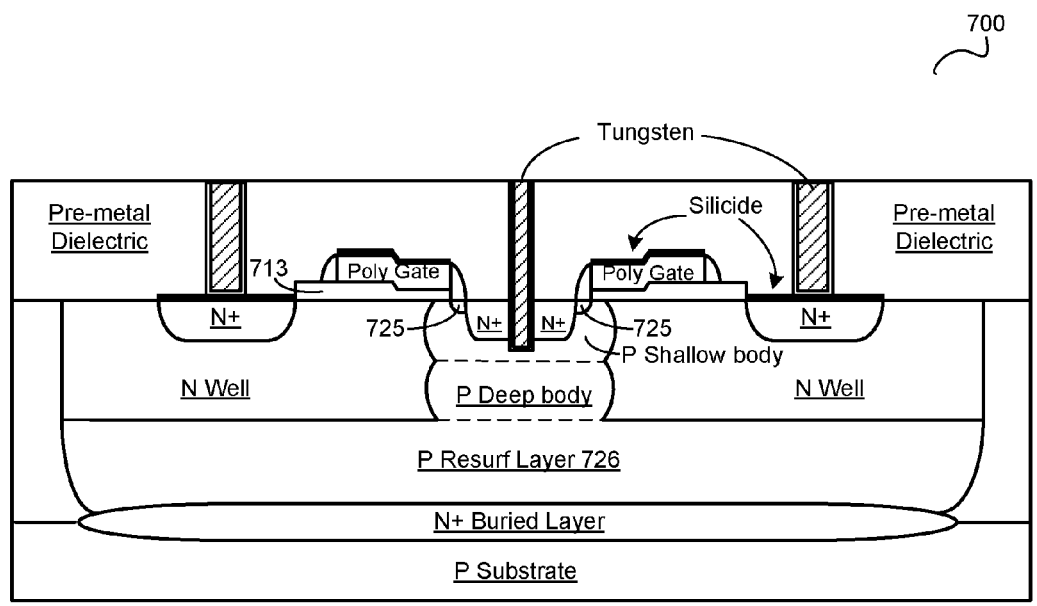
FIG. 7 illustrates a sectional view of an LDMOS 700 with trench source contact in accordance with yet another embodiment of the present invention.

FIG. 7 shows an LDMOS 700 with trench source contact in accordance with yet another embodiment of the present invention. In the device 700 of FIG. 7, there is a stepped gate oxide region 713, with thin gate oxide near the source and a thicker oxide near the drain. For lower-voltage devices, this is not necessary, and the gate polysilicon can be disposed wholly over thin gate oxide, just as shown in FIG. 3.

In FIG. 7, it further shows a p-type "Resurf" layer 726 underlying the entire active device. The purpose of this p-type region is to deplete the n-type drift region (N well) from the bottom as well as from the source side, reducing the lateral electric field and thereby increasing the breakdown voltage. In a Resurf device, the deep body region must be deep enough to make electrical contact with the p-type Resurf layer 726, which is typically more than 0.5 um deep for breakdown voltages of 20V and above.

Further referring to the device 700 of FIG. 7, there are shallow N-type regions 725 which underlap the gate polysilicon region and form the actual source of the LDMOS. These shallow n-type source regions may be implanted through the same photoresist layer with the shallow and deep body regions.

It should be known that the doping type for each region in the above embodiments may be in an alternating type, for example, the N type regions may be replaced with P type regions, and vice versa. Moreover, the N type dopants can be selected from one of the following: nitrogen, phosphorus, arsenic, antimony, bismuth and the combination thereof, while the P type dopants can be selected from one of the following: boron, aluminum, gallium, indium, thallium and the combination thereof.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A method for fabricating an LDMOS device, comprising:
    forming a semiconductor substrate;
    forming a dielectric layer atop the semiconductor substrate;
    forming an electric conducting layer on the dielectric layer;
    forming a first photoresist layer on the electric conducting layer;
    patterning the first photoresist layer through a first mask to form a first opening;
    etching the electric conducting layer through the first opening;
    implanting dopants of a first doping type into the semiconductor substrate through the first opening, to form a first body region adjacent to the surface of the semiconductor substrate, and a second body region located beneath the first body region, wherein the semiconductor substrate laterally outside of the first opening is all covered by both the electric conducting layer and the first photoresist layer to block the implant of the dopants;
    removing the first photoresist layer after the steps of etching and implanting through the first opening; and
    etching the electric conducting layer using a second photoresist layer and a second mask after the first photoresist layer is removed.

2. The method of claim 1, wherein the step of forming the semiconductor substrate comprises:
    forming a buried layer of the second doping type in an original substrate of the first doping type.

3. The method of claim 2, wherein the step of forming the semiconductor substrate further comprises:
    forming a well of the second doping type in the original substrate.

4. The method of claim 2, wherein the step of forming the semiconductor substrate further comprises:
    forming a resurf layer of the first doping type above the buried layer and contacting the second body region.

5. The method of claim 1, wherein the dielectric layer comprises a gate oxide layer and the electric conducting layer comprises a gate polysilicon layer.

6. The method of claim 1, further comprising:
    implanting dopants of a second doping type into the semiconductor substrate through the first opening to a depth shallower than the first body region.

7. The method of claim 1, further comprising:
    forming spacers at the sidewalls of the electric conducting layer;
    implanting dopants of a second doping type into the semiconductor substrate to form a source region in the first body region:
    forming a pre-metal dielectric layer on the semiconductor substrate;
    etching the pre-metal dielectric layer to form a second opening using a third mask and a third photoresist layer;
    etching the semiconductor substrate inside the second opening to a depth greater than the maximum junction depth of the source region;
    depositing a contact liner and annealing; and
    depositing metal and polishing.

* * * * *